United States Patent

[11] 3,611,066

[72] Inventor Rudolph Knaus
Auburn, N.Y.
[21] Appl. No. 884,590
[22] Filed Dec. 12, 1969
[45] Patented Oct. 5, 1971
[73] Assignee General Electric Company

[54] THYRISTOR WITH INTEGRATED BALLASTED GATE AUXILIARY THYRISTOR PORTION
12 Claims, 3 Drawing Figs.

[52] U.S. Cl. .......................................................... 317/235 R,
317/235 AA, 317/235 AB, 317/234 N, 29/589
[51] Int. Cl. .......................................................... H01l 11/00,
H01l 15/00
[50] Field of Search ............................................. 317/234,
235, 41, 41.1, 6, 5.4; 29/584–589

[56] References Cited

UNITED STATES PATENTS

| | | | |
|---|---|---|---|
| 3,462,620 | 8/1969 | Weinstein ..................... | 317/235 X |
| 3,476,989 | 11/1969 | Miles et al. .................... | 317/235 |
| 3,486,088 | 12/1969 | Gray et al. ..................... | 317/235 |
| 3,526,815 | 9/1970 | Svedberg et al. ............. | 317/234 X |

FOREIGN PATENTS

| | | | |
|---|---|---|---|
| 1,164,465 | 9/1969 | Great Britain ................ | 317/235 |

*Primary Examiner*—James D. Kallam
*Assistant Examiner*—Andrew J. James
*Attorneys*—Robert J. Mooney, Nathan J. Cornfeld, Carl O. Thomas, Frank L. Neuhauser, Oscar B. Waddell and Joseph B. Forman

ABSTRACT: A thyristor comprised of a main current carrying thyristor portion and an auxiliary thyristor portion integrated therewith for tuning on the main thyristor portion is provided with a passive ballast segment interposed between the gate and an adjacent edge of the emitter layer to increase lateral resistance in series with the emitter junction thereby to laterally distribute turn-on current and to retard turnoff current. A second ballast segment may be provided between the auxiliary and main thyristor portions or the lateral resistance between these thyristor portions may be increased by constricting the width of the adjacent integral base layer extending between the thyristor portions. The auxiliary and main thyristor portions may be interdigitated to accelerate turn-on response.

PATENTED OCT 5 1971 3,611,066

INVENTOR:
RUDOLPH KNAUS,

BY Carl O. Thomas
HIS ATTORNEY.

THYRISTOR WITH INTEGRATED BALLASTED GATE AUXILIARY THYRISTOR PORTION

The invention herein described was made in the course of a contract with the Department of the Navy.

My invention relates to a controlled thyristor having an improved capability for uniform turn on and protection against turn off.

As is well understood in the art gate controlled thyristors are limited in the rate at which current conduction can be increased, typically referred to as di/dt. It has also been observed that the maximum safely employable value of di/dt for a given thyristor is a direct function of the value of the gate signal being utilized to control the thyristor.

To improve turn on rates and to allow weaker gate signals to be utilized safely it has heretofore been proposed to separate the cathode emitter layer of a thyristor into a main and an auxiliary segment in which the gate signal turns on the auxiliary segment of the thyristor and the auxiliary segment is utilized to turn on the main segment. In this arrangement a weak gate signal is acceptable, since the auxiliary thyristor portion of the device is small as compared with the main thyristor portion. Further, the auxiliary thyristor portion acts like an intermediate amplifier in transmitting the gate signal to the main thyristor portion for turn on thereof.

While the use of an auxiliary thyristor portion is noted to represent an improvement in turn on characteristics, it is still a difficulty that only localized turn on of either the main or auxiliary thyristor portions may occur and that localized current crowding may result in device failure. Further, whereas the gate is initially positive with respect to the cathode in order to transmit the turn on signal thereto, once a localized portion of the cathode is turned on, it approaches the potential of the anode and may become positive with respect to the gate. This can result in a turn off current flowing out the gate lead producing localized current crowding and device failure. This can occur either as a result of current flow from the auxiliary thyristor portion to the gate lead or from the main thyristor portion to the auxiliary thyristor portion.

It is an object of my invention to provide a gate controlled thyristor including an auxiliary thyristor portion which is superiorly protected against localized high current densities which can produce device failure through localized overheating.

It is another object of my invention to incorporate into a gate controlled thyristor including an auxiliary thyristor portion a capability for rapidly distributing current at turn on and for limiting current flow tending to turn the device off.

These and other objects of my invention are accomplished in one aspect by providing a thyristor comprised of a semiconductive element including four layers of one and the opposite conductivity type. The layers are interleaved with adjacent layers being of opposite conductivity type and forming a plurality of P-N junctions. The layers include a first emitter layer and a first base layer next adjacent thereto. The first emitter layer includes a main segment and an auxiliary segment spaced laterally therefrom. Gate means is associated with a first portion of the first base layer separated from the main segment by the auxiliary segment. Means are provided to form a junction bridging conductive path from the auxiliary segment to a second portion of the first base layer interposed between the main and auxiliary segments. A second emitter layer is provided, and first and second major contacts are associated with the main segment and the second emitter layer, respectively. The portions of the base layer each have associated therewith lateral resistance means for laterally spreading current flow therethrough, and at least one of the lateral resistance means includes a diffused ballast segment forming a passive portion of the first emitter layer.

My invention may be better appreciated by reference to the following detailed description considered in conjunction with the drawings, in which.

In the figures the sectional views are shown with the thickness greatly exaggerated as compared to the width in order to allow the structural features of the embodiments to be more readily viewed. Section lines are omitted from the semiconductive elements to avoid cluttering the drawings.

Figure 1:
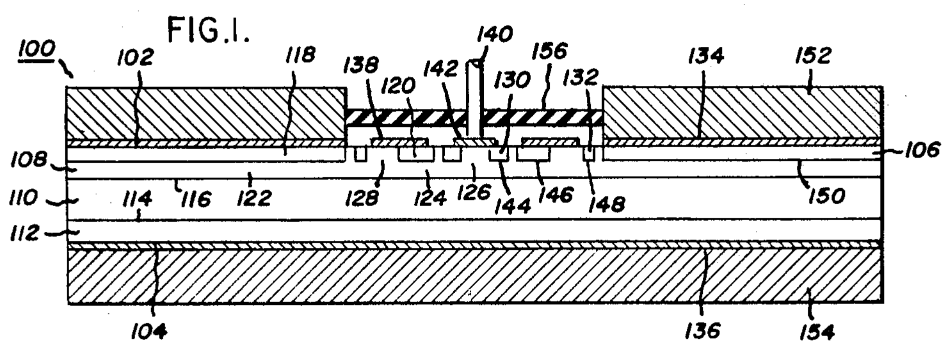
FIG. 1 is a schematic vertical section of a first embodiment of my invention.

In FIG. 1 a semiconductive element 100, which may be monocrystalline silicon, is shown provided with a first major surface 102 and a second major surface 104. The semiconductive element is comprised of four sequentially arranged layers extending between the opposed major surfaces. First emitter layer 106 lies adjacent the first major surface. First base layer 108 lies adjacent the first emitter layer with portions extending to the first major surface. A second base layer 110 lies adjacent the first base layer, and a second emitter layer 112 lies between the second base layer and the second major surface. Adjacent layers are formed of opposite conductivity type, so that P-N junctions are interposed therebetween. An emitter junction 114 is formed between the second emitter and base layers, while a base junction 116 is formed between the base layers.

The first emitter layer is laterally segmented by intervening portions of the first base layer so that a plurality of functionally independent junctions are formed between these layers. The first emitter layer includes a main segment 118 and an auxiliary segment 120 which are laterally spaced. The first base layer includes a main zone 122 underlying the main segment and an auxiliary zone 124 underlying the auxiliary segment. A gate zone 126 lies interiorly of the auxiliary zone while a lateral zone 128 extends between the main and auxiliary zones. A first diffused ballast segment 130 of the first emitter layer is formed to lie interiorly of the auxiliary segment. A second diffused ballast segment 132 of the first emitter layer is associated with the lateral zone between the main and auxiliary segments. In the form shown each of the segments of the first emitter layer are annular in configuration and are concentrically arranged.

A first major contact 134 is conductively associated with the main segment of the first emitter layer. A second major contact 136 is conductively associated with the second major surface of the second emitter layer. A conduction layer 138 overlies an outer portion of the auxiliary segment and extends laterally outwardly thereof in conductive association with the lateral zone of the first base layer. The conduction layer is laterally spaced inwardly from the second diffused ballast segment. Gate 140 through gate metallization 142 is associated with a central portion of the gate zone at the first major surface and extends outwardly to overlie the inner edge of the first diffused ballast segment.

In looking at the junctions between the first emitter and base layers, it is readily apparent that the gate metallization shorts the inner edge of the first ballast junction 144 formed between the first ballast segment and the gate zone. At the same time the conduction layer shorts the outer edge of the auxiliary emitter junction 146 formed between the auxiliary segment and the first base layer. The second ballast junction 148 formed by the second ballast segment and the lateral zone is not shorted. The first main contact may be shorted to the main zone of the first base layer in a manner well understood in the art, but the main emitter junction 150 formed by the main segment and main zone preferably is not shorted by the first major contact adjacent its inner periphery. Although the first major contact is shown coextensive with the first emitter layer, in practice the first major contact is formed with its inner edge spaced slightly outwardly of the inner edge of the first emitter layer.

While for simplicity the gate metallization, conduction layer, and first and second major contacts are shown formed as unitary metal layers, it is appreciated that these elements may be formed of one or a plurality of layers of like or dissimilar metals, as is well understood in the art. It is preferred that these elements be plated or otherwise bonded directly onto the opposed major surfaces of the semiconductive element prior to its association with the remaining elements of the semiconductor device, so that these elements form a low impedance interface with the semiconductive element.

First and second back up plates 152 and 154 are associated with the first and second major contacts, respectively. These back up plates are shown laterally coextensive with the major contacts. Where the semiconductive element is formed of a silicon crystal it is preferred to utilize a metal, such as tungsten, molybdenum, Fernico, Kovar, or tantalum, which exhibits a thermal coefficient of less than $1 \times 10^{15}$ in/in per °C., most preferably less than $0.5 \times 10^{15}$ in/in per °C. One or both of the back up plates may be directly bonded to the major contacts or only physically associated therewith, free of direct bonding. The exterior major surfaces of the back up plates may be associated with a malleable conductive metal layer or preform, such as silver or gold, where the back up plate is intended to cooperate with a terminal member.

A dielectric spacer 156 is shown interposed between the upper back up plate and the gate lead. This spacer assures maintenance of the relative positioning of the back up plate and gate lead shown. Additionally, the spacer protects the second diffused ballast segment from conductive association with the conduction layer or device contacts.

The combination shown in FIG. 1 may be used as a complete semiconductor device where the ambient environment is specially controlled to be free of moisture and other contaminants. More commonly the combination shown will be utilized in a hermetically sealed semiconductor device housing of conventional construction. For example, the combination shown may be incorporated in a hermetically sealed housing, such as that currently sold by the General Electric Company as a part of its 4JC398 thyristor. Instead of placing the combination shown in a hermetically sealed housing, it may be encapsulated by a protective passivant material, such as silicone resin, glass, etc., as is well understood in the art. The manner of packaging the thyristor shown forms no part of my invention.

Construction of the combination shown in FIG. 1 may be achieved according to techniques well understood in the art. Typically the layers of the semiconductive element are formed by taking a silicon crystal having conductivity characteristics throughout conforming to that of the second base layer. The first base and second emitter layers may then be formed by diffusing into the crystal from the opposite major surfaces an impurity of a conductivity type opposite to that of the second base layer. Thus the emitter junction 114 and base junction are formed. It is also important to note that in this instance the resistivity of the first base layer will increase in a direction from the first major surface toward the base junction. The segmented first emitter layer may be formed by suitably masking the first major surface and forming each of the layers simultaneously. It is recognized that the main and auxiliary segments may be formed by either diffusion or alloying techniques. It is preferred, however, that the ballast segments be formed by diffusion. The reason for this is that the uniformity and depth of diffused junctions can be controlled with a high degree of precision. This, of course, allows close control of the resistance to current flow imparted to the associated portions of the first base layer as a result of constricting the width thereof adjacent the ballast segments. In this regard it should be noted that it may be desirable to undertake separate diffusions to form the various segments of the first emitter layers, so that each segment can be formed to a depth optimum for the function it is to perform. It is particularly important that the second ballast segment in the form shown in FIG. 1 be formed by diffusion, since having a very low resistance surface layer associated with the second ballast segment may prevent this segment from remaining passive during device operation as is desired. The gate metallization associated with the first ballast segment effectively prevents charge injection by this segment whether formed by diffusion or alloying techniques, but where the metallization is spaced inwardly from the inner edge of the inner ballast segment, this segment also should be formed by diffusion to insure that it remains passive under common operating conditions. The above description of fabrication techniques is intended merely to be illustrative, since it is recognized that a variety of layer forming techniques are known to the art and may be readily applied to the fabrication of my structure once its essential characteristics are appreciated.

Operation of the thyristor of FIG. 1 is described with reference to a preferred form in which the first emitter layer is of N-type conductivity and the second emitter is of P-type conductivity. It is, of course, recognized that this relationship of the emitter layers could be reversed without materially affecting the utility of my invention.

When a positive potential is applied to the first major contact 134 as compared to the second major contact 136, the thyristor is in its reverse blocking condition and no current flows through the semiconductive element, since the emitter junction 114 is reverse biased. When the applied potential is reversed so that the second major contact 136 is positive with respect to the first major contact, the semiconductive element, although forward biased, remains nonconductive in the absence of a gate signal, since the base junction 116 is in this instance reverse biased and prevents current flow thereacross.

When the device is forward biased it may be easily switched from its current blocking or high impedance mode to its low impedance or conducting mode merely by biasing the gate lead 140 positive with respect to the first major contact. This causes a current to flow from the gate lead to the first major contact. Current flows from the gate metallization 142 interiorly of the first ballast segment 130 through the gate zone 126 and under the first ballast segment outwardly to the inner periphery of the auxiliary segment 120. From the auxiliary segment current flows outwardly through the conduction layer 138 so that the auxiliary junction 146 is bridged. Current flows from the conduction layer through the lateral zone 128 beneath the second ballast segment 148 to the inner edge of the main segment 118. Current flows from the inner edge of the main segment to the first major contact.

Current flow across the auxiliary segment produces a potential gradient laterally across this segment which causes electrons to be injected into the first base layer 108 from the auxiliary segment along the inner edge of the auxiliary junction. This tends to break down the depletion layer associated with the base junction immediately therebeneath and initiates current flow along the interior edge of the auxiliary segment from the second major contact. This current on reaching the auxiliary segment follows the path of the gate signal as previously described in reaching the first major contact. The gate signal current augmented many fold by the current from the second major contact causes electron injection from the inner edge of the main segment into the main zone 122 of the first base layer therebeneath further to break down the depletion layer associated with the base junction and to permit a still larger current flow to take place between the first and second major contacts.

It may be readily observed that if the first diffused ballast segment 130 were absent from the device and a very small lateral spacing were present between the outer edge of the gate metallization and the inner edge of the auxiliary junction, as is typical of conventional thyristors including auxiliary thyristor portions, a very low resistance path is provided between the gate metallization and the auxiliary junction. When the gate signal is first applied to the device no current flows until a potential gradient is achieved sufficient to cause forward conduction across the auxiliary junction. Typically a potential gradient of less than one volt is necessary to achieve forward conduction through a P-N junction. I have observed that when a particular point on the inner edge of the auxiliary segment is turned on by a gate signal in conventional thyristors, current flow may not necessarily spread laterally so that the entire auxiliary segment is turned on immediately. If the area of initial turn on is quite small and if a large current density occurs in this restricted area, instantaneous excessive localized overheating of the semiconductive element may occur causing permanent damage of the semiconductive element and destruction of the device.

By placing the first diffused ballast zone between the gate metallization and the inner edge of the auxiliary segment I increase the length of the current path between these sites and thereby increase the resistance in series with the resistance offered by the auxiliary junction. This series resistance acts to limit current flow through the point on the inner edge of the auxiliary segment turned on first permitting a sufficient potential difference to be maintained across the auxiliary junction to turn on the entire inner edge of the auxiliary segment. Thus, the diffused ballast segment 130 acts to provide a series resistance to gate signal current which causes this current to be laterally distributed in a substantially uniform manner for turn on of the entire inner edge of the auxiliary segment. It is to be noted that the first diffused ballast segment differs from the auxiliary and main segments of the first emitter layer in that it remains passive and does not act as a charge injector or emitter. This behavior of the first ballast segment in the form shown in FIG. 1 is directly attributable to the gate metallization shorting the inner edge of the first ballast junction. If shorting of the inner edge of the junction 144 is omitted, the first ballast segment can still remain passive if the lateral resistance of the first base layer therebeneath is chosen to provide a potential drop laterally across the first ballast segment in response to a gate signal which is less than the sum of the forward conducting and maximum reverse blocking potentials of the first ballast junction. In other words, the first ballast segment remains passive so long as the gate to auxiliary segment current encounters a lower resistance flowing beneath the first ballast segment than therethrough. The maximum reverse blocking potential sustainable by the first ballast junction being a direct function of surface resistivity, an etched down or otherwise relieved portion of the first major surface adjacent the outer edge of the first ballast junction can be incorporated to insure that the first ballast segment remains passive where the semiconductive element is formed with the resistivity of the first ballast segment and the first base layer increasing inwardly, as is typical of layers formed by diffusion.

The second diffused ballast segment functions to prevent the semiconductive element from being damaged as a result of current crowding induced by turn on of the main segment over a small area adjacent its inner edge. The signal current together with the current from the second major contact transmitted through the auxiliary segment—i.e., the current output of the auxiliary thyristor portion of the device—is deflected beneath the second ballast segment. This increases the length of the current path as well as forcing the current to flow through the underlying portion of the first base layer constricted in width by the second ballast segment. Additionally, where the first base layer is formed by diffusion, current flow is deflected from the upper, lower resistivity portion of the base layer to the lower, higher resistivity portion. All of these factors together contribute to cause the second ballast segment to increase the lateral resistance to current flow in series with the forward resistance of the main emitter junction 150. Accordingly, when a point on the inner edge of the main segment turns on, this additional series resistance will contribute to maintaining the necessary potential difference across the main emitter junction to allow the entire inner edge of the junction to be turned on and current flow to be laterally distributed in a substantially uniform manner. For this reason current crowding, localized overheating, and damage to the device as a result thereof are avoided. Maintenance of the second diffused ballast segment in a passive, noncharge injecting state can be more reliably achieved by extending the conduction layer outwardly to short the inner edge of the second ballast junction. In the form shown, the resistance beneath the second ballast segment of the first base layer is chosen to provide a potential drop laterally across the second ballast segment in response to the gate signal and the current signal of the auxiliary thyristor portion which is less than the sum of the forward conducting and maximum reverse blocking potentials of the second ballast junction. Again, relieving of the first major surface adjacent the outer edge of second ballast junction may be relied upon to increase its maximum reverse blocking voltage and hence to insure the passiveness of the second ballast segment.

In addition to improving the uniformity of current flow during turn on, allowing rapid turn on with greater reliability, the ballast segments of my invention also protect against device damage attributable to any tendency of the device to turn off prior to full turn on. When a small area at the inner edge of the auxiliary segment has turned on, for example, it may rise to a potential level approaching that of the second major contact. In this instance the turned on portion of the auxiliary segment may be positive with respect to the gate lead, rather than negative with respect to the gate lead as it is at the instant the gate signal is first received. The reversal of polarity between the turned on area of the auxiliary segment and the gate lead can give rise to a reverse or turnoff current flow from the device out the gate lead. This, of course, tends to cancel at least a portion of any gate signal being delivered to the device through the gate lead. Accordingly, available gate signal for spreading the turned on area of the auxiliary segment is diminished while at the same time current density passing from the second major contact to the auxiliary segment is rising rapidly. In the absence of the first ballast segment it is possible for the initially turned on area of the auxiliary segment to become overheated due to the current crowding directly attributable to the turnoff mechanism described. The ballast segment, however, in creating an increased series lateral resistance between any turned on area of the auxiliary segment and the gate lead functions to limit this current and suppresses any device tendency toward turnoff. In a generally analogous manner the second ballast segment similarly minimizes any tendency toward current crowding along the inner edge of the main segment due to the turnoff mechanism. It is, of course, recognized that the ballast segment will protect against device time turnoff should the gate lead be biased negative at any time when any portion of the device is turned on. In most instances it is preferred that the lateral resistance created in the first base layer by the first ballast segment exceed the lateral resistance created by the second ballast segment, since a larger turnoff current can be tolerated by the main thyristor portion than by the auxiliary thyristor portion.

Figure 2:
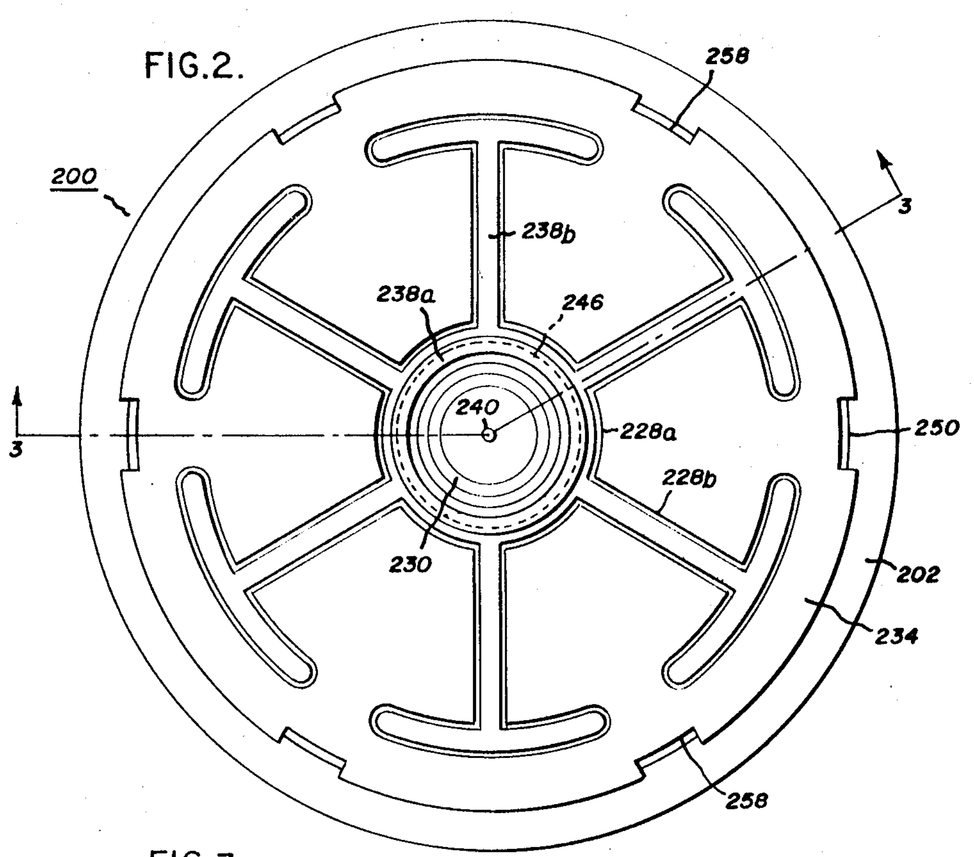
FIG. 2 is a plan view of a modified embodiment of my invention in which a semiconductive element is shown together with a gate lead, contacts, and a conduction layer.
Figure 3:
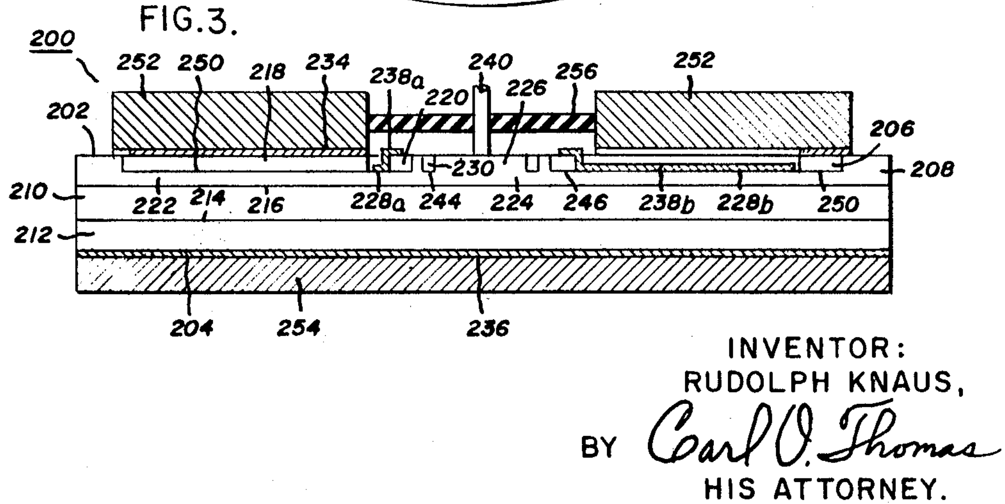
FIG. 3 is a schematic sectional view taken along section line 3–3 in FIG. 2 and additionally including an upper back up plate and dielectric spacer omitted from FIG. 2.

In FIGS. 2 and 3 a second embodiment of my invention is shown in which a semiconductive element 200 having first and second major surfaces 202 and 204, respectively, is provided with four layers 206, 208, 210 and 212. Adjacent layers are of opposite conductivity type. An emitter junction 214 is formed between the second emitter layer 212 and the second base layer 210 while a base junction 216 is formed between the second base layer and first base layer 208. The first emitter layer 206 is comprised of a main segment 218, an auxiliary segment 220, and a diffused ballast segment 230. The ballast segment forms a ballast junction 244 with the first base layer while the auxiliary segment forms an auxiliary junction 246 with the first base layer. The main segment forms a main junction 250 with the first base layer.

The first base layer is formed of a main zone 222 underlying the main segment of the first emitter layer and an auxiliary zone 224 underlying the auxiliary segment. A gate zone 226 extends from the inner edge of the auxiliary junction inwardly. A lateral zone formed of a central portion **228*a* and laterally extending finger portions 228*b*** extends from the outer edge of the auxiliary segment to the main segment. The lateral zone is noted to have its outer surface spaced inwardly from the first major surface of the semiconductive element. This may be accomplished merely by etching down from the first major surface.

A first major contact 234 is associated in conductive relation with the main segment. The first major contact is preferably spaced laterally slightly from the lateral zone of the first base layer to insure that no portion of the first major contact shorts to the lateral zone rather than being coextensive with the inner edge of the main segment as shown. At the same time the outer periphery of the first major contact extends outwardly past the outer edge of the main junction 250 to short to the outer edge of the first base layer. To avoid edge shorting over the entire periphery of the first major contact, however, a plurality of insets 258 are formed in the periphery of the first major contact which cause a portion of its edge to terminate inwardly of the outer edge of the main junction. Second major contact 236 is associated with the second major surface.

A conduction layer is formed of a central portion 238*a* and a plurality of integral finger portions 238*b*. The central portion of the conduction layer provides a conductive path from the auxiliary segment to the central portion of the lateral zone shorting the outer edge of the auxiliary junction 246. The finger portions of the conduction layer overlie the finger portions of the lateral zone, but are located centrally thereof and are laterally spaced from the main segment. A gate lead 240 is located centrally of the semiconductive element associated with the gate zone adjacent the first major surface and inwardly of the ballast segment. The gate lead may be associated with gate metallization, not shown. The gate metallization may be spaced inwardly of the ballast segment 230 or overlap its inner edge. A back up plate 252 is associated with the first major contact which may be identical to back up plate 152. A circular back up plate 254 is associated with the second major contact. A dielectric spacer 256 is provided to maintain relative spacing between the gate lead and the back up plate 254. The dielectric spacer also protects the diffused ballast segment from conductive association with the terminals of the device.

Operation of the combination shown in FIGS. 2 and 3 is generally similar to the FIG. 1 embodiment of my invention, but differs in certain specifics to be noted. First, it is to be noticed that the gate lead is not provided with associated metallization which shorts the inner edge of the ballast junction 244. In this embodiment of the invention the low potential drop to current flow beneath the ballast segment as compared to current flow therethrough is relied upon to maintain this segment in a passive, noncharge injecting state during device operation, as previously discussed. The spacing between the conduction layer and the main segment requires current flow through an intervening portion of the lateral zone of the first base layer which is spaced inwardly from the first major surface. Where the base layer is formed by diffusion so that its resistivity increases inwardly, this relationship increases the lateral resistance to current flow provided by the first base layer over what would be present if the lateral zone extended to the first major surface. Accordingly the need to rely upon a ballast segment between the auxiliary segment and the main segment in order to increase lateral current resistance and to cause current spreading is obviated, although a ballast segment could still be interposed in the lateral zone, if desired. It should be noted, however, that the ballast segment between the gate and the auxiliary segment is retained. The reason for this is that the use of at least one ballast segment is considered an essential feature of my invention, since a diffused ballast segment can create a lateral resistance controllable with greater accuracy and uniformity than can be achieved by merely etching the first base layer from the first major surface. Since the accurate control of resistance between the gate and auxiliary segment is more critical to satisfactory device performance than the resistance between the conduction layer and main segment, I prefer to retain the ballast zone in the location shown. Etch down of the first base layer over its lateral zone offers the supplementary advantage of allowing the finger portions of the conduction layer to be spaced inwardly of the back up plate 252. Accordingly, the back up plate may be annular and requires no indexing to achieve an alignment with respect to the finger portions as does the first major contact, for example. It is, of course, recognized that the finger portions could be extended outwardly in the plan of the first major surface and the back up plate 252 could be formed with slots aligned with the finger portions for providing separation from the conduction layer. The finger portions of the conduction layer serve to increase the peripheral area of the conduction layer from which turn on current can spread to the main segment and functions to accelerate the turn on of the main segment. Note that the finger portions greatly reduce the mean distance between an areal unit of the emitter segment and the outer periphery of the conduction layer.

While I have described my invention with reference to certain preferred embodiments, it is appreciated that numerous modifications will readily occur to those skilled in the art. For example, instead of forming a thyristor with a center gate as shown, my invention could be applied to a peripheral or distributed gate thyristor. Also, instead of using a semiconductive element of circular cross section my invention may be applied to a semiconductive element of any conventional geometrical configuration. It is accordingly intended that the scope of my invention be determined with reference to the following claims.

What I claim and desire to secure by Letters Patent of the United States is:

1. A thyristor comprised of a semiconductive element including four layers of one and the opposite conductivity type, said layers being interleaved with adjacent layers being of opposite conductivity type and forming a plurality of P-N junctions, said layers including a first emitter layer including a main segment and an auxiliary segment spaced laterally therefrom, a first base layer next adjacent to said first emitter layer including a first portion separated from said main segment by said auxiliary segment, a second portion interposed between said auxiliary and said main segments, and remaining portions integral with said first and second portions overlying said auxiliary and said main segments, gate means associated with said first portion of said first base layer separated from said main segment by said auxiliary segment, means providing a junction bridging conductive path from said auxiliary segment to said second portion of said first base layer interposed between said main and auxiliary segments, a second emitter layer, first and second major contacts associated with said main segment and said second emitter layer, respectively, said first and second portions of said base layer each having associated therewith lateral resistance means for laterally spreading current flow therethrough including ballast segment means forming passive segments of said first emitter layer.

2. A thyristor according to claim 1 in which said resistance means associated with said first portion exceeds in value said resistance means associated with said second portion.

3. A thyristor according to claim 1 in which said ballast segment means is associated with said first portion forming a junction therewith and said gate means includes a conductive portion bridging an adjacent edge of said junction.

4. A thyristor according to claim 1 in which said gate means is located centrally with respect to said semiconductive element and said first emitter layer segments are of annular configuration and concentrically located with respect to said gate means.

5. A thyristor according to claim 1 additionally including means isolating said ballast segment means from conductive association with said contacts.

6. A thyristor according to claim 1 in which said first base layer incorporates a lateral resistance beneath said ballast segment which produces a potential gradient in response to a turn on current therethrough less than the sum of the forward conduction and maximum reverse blocking potentials of the junction between said ballast segment means and said first base layer.

7. A thyristor according to claim 1 in which said ballast segment means is located between said auxiliary segment and said main segment and said junction bridging means overlies an inner edge thereof.

8. A thyristor comprised of a semiconductive element including four layers of one and the opposite conductivity-type, said layers being interleaved with adjacent layers being of opposite conductivity-type and forming a plurality of P-N junctions, said layers including a first emitter layer and a first base layer next adjacent thereto, said first emitter layer including a main segment and an auxiliary segment spaced laterally therefrom, said first base layer including a main zone underlying said main segment, an auxiliary zone underlying said auxiliary segment, gate zone means separated from said main zone by said auxiliary zone, and lateral zone means interposed between said main and auxiliary zones, gate means associated with said gate zone means in laterally spaced relation to said auxiliary segment, a second emitter layer, first and second major contacts associated with said main segment and said second emitter layer, respectively, means providing a junction bridging conductive path from said auxiliary segment to said lateral zone means of said first base layer, first lateral resistance means interposed between said gate means and said auxiliary segment for laterally spreading current flow therebetween, and second lateral resistance means interposed between and spaced from said conductive path means and said main segment for laterally spreading current flow therebetween including diffused ballast segment means forming a passive segment of said first emitter layer.

9. A thyristor comprised of a semiconductive element including a first emitter layer adjacent a first major surface, a first base layer adjacent said first emitter layer, a second emitter layer adjacent a second, opposed major surface, and a second base layer interposed between said first base layer and said second emitter layer, adjacent of said layers being of opposite conductivity-type type and said layers forming P-N junctions therebetween, said first emitter layer including a main segment and an auxiliary segment spaced laterally therefrom, said first base layer including a main zone underlying said main segment, an auxiliary zone underlying said auxiliary segment, gate zone means separated from said main zone by said auxiliary zone and located adjacent said first major surface, and lateral zone means interposed between said main and auxiliary zones and spaced inwardly from said first major surface, gate means associated with said gate zone means in laterally spaced relation to said auxiliary segment, first and second major contacts associated with said main segment and said second emitter layer, respectively, means providing a junction bridging conductive path from said auxiliary segment to said lateral zone means of said first base layer, said conductive path means being laterally spaced from the junction formed by said main segment and said main zone, and ballast segment means interposed between and spaced from said gate means and said auxiliary segment for laterally spreading current flow therebetween forming a passive portion of said first emitter layer.

10. A thyristor according to claim 9 in which said lateral zone means include a plurality of laterally extending finger portions separated by said main segment and said conductive path means include finger portions overlying said zone means finger portions.

11. A thyristor according to claim 9 in which said first base layer progressively increases in resistivity in a direction taken from said first major surface toward said second base layer.

12. A thyristor according to claim 9 additionally including a backup plate associated with said first major contact and overlying said conductive path means in spaced relation thereto.